United States Patent
Kim et al.

(10) Patent No.: US 9,391,125 B2
(45) Date of Patent: Jul. 12, 2016

(54) ORGANIC LIGHT EMITTING DIODE DISPLAY INCLUDING DUMMY CIRCUIT PORTIONS

(71) Applicant: SAMSUNG DISPLAY CO., LTD., Yongin, Gyeonggi-Do (KR)

(72) Inventors: Tae Gon Kim, Cheonan-si (KR); Se-Ho Kim, Cheonan-si (KR); Jae-Sic Lee, Cheonan-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/312,840

(22) Filed: Jun. 24, 2014

(65) Prior Publication Data

US 2015/0102302 A1   Apr. 16, 2015

(30) Foreign Application Priority Data

Oct. 10, 2013   (KR) .......................... 10-2013-0120694

(51) Int. Cl.
| | |
|---|---|
| H01L 29/08 | (2006.01) |
| H01L 27/32 | (2006.01) |
| G09G 3/20 | (2006.01) |
| G09G 3/32 | (2016.01) |

(52) U.S. Cl.
CPC .......... *H01L 27/3223* (2013.01); *G09G 3/2003* (2013.01); *G09G 3/3225* (2013.01); *H01L 27/3276* (2013.01); *G09G 2300/0413* (2013.01); *G09G 2330/08* (2013.01); *H01L 2251/568* (2013.01)

(58) Field of Classification Search
None
See application file for complete search history.

(56) References Cited

U.S. PATENT DOCUMENTS

| | | |
|---|---|---|
| 2002/0136207 A1 | 9/2002 | Matsumoto et al. |
| 2009/0294771 A1 | 12/2009 | Kim et al. |
| 2010/0157190 A1* | 6/2010 | Lee et al. .......................... 349/54 |
| 2012/0013598 A1 | 1/2012 | Choe |

FOREIGN PATENT DOCUMENTS

| | | |
|---|---|---|
| JP | 2007-316511 A | 12/2007 |
| KR | 10-0483386 B1 | 4/2005 |
| KR | 10-2008-0022357 A | 3/2008 |

(Continued)

OTHER PUBLICATIONS

US Office Action for U.S. Appl. No. 14/312,898 dated Jul. 17, 2015; Kim, et al.

(Continued)

*Primary Examiner* — Calvin Choi
*Assistant Examiner* — Xiaoming Liu
(74) *Attorney, Agent, or Firm* — Lee & Morse, P.C.

(57) ABSTRACT

An organic light emitting diode display includes a substrate having a display unit and a peripheral portion, scan lines in a first direction, data lines in a second direction, pixels in the display unit and having pixel circuit portions and organic light emitting diodes, first dummy lines in the display unit and extending in the first direction, at least one second dummy line in the peripheral portion and extending in the second direction, dummy circuit portions connected to a first dummy line and the at least one second dummy line, driving pads connected to end portions of the data lines, at least one dummy driving pad connected to an end portion of the at least one second dummy line, and a driving circuit configured to transmit a data signal to the driving pads and to the at least one dummy driving pad.

6 Claims, 9 Drawing Sheets

(56) References Cited

FOREIGN PATENT DOCUMENTS

| KR | 10-2008-0024009 A | 3/2008 |
|----|-------------------|--------|
| KR | 10-2008-0044073 A | 5/2008 |
| KR | 10-2010-0065745 A | 6/2010 |

OTHER PUBLICATIONS

US Office Action dated Oct. 27, 2015 in Corresponding U.S. Appl. No. 14/312,898.

* cited by examiner

ORGANIC LIGHT EMITTING DIODE DISPLAY INCLUDING DUMMY CIRCUIT PORTIONS

CROSS-REFERENCE TO RELATED APPLICATION

Korean Patent Application No. 10-2013-0120694, filed on Oct. 10, 2013, in the Korean Intellectual Property Office, and entitled: "Organic Light Emitting Diode Display And Repairing Method Thereof," is incorporated by reference herein in its entirety.

BACKGROUND

1. Field

Embodiments relate to an organic light emitting diode display and a repair method.

2. Description of the Related Art

An organic light emitting diode display may include two electrodes and an organic light emitting layer positioned therebetween. Electrons injected from one of the electrodes, i.e., a cathode, and holes injected from another of the electrodes, i.e., an anode, are bonded to each other in the organic light emitting layer to form excitons. Light is emitted while the excitons discharge energy.

The organic light emitting diode display includes a plurality of pixels including an organic light emitting diode formed of the cathode, the anode, and the organic light emitting layer. A plurality of thin film transistors and capacitors for driving the organic light emitting diode are formed in each pixel.

The organic light emitting diode display may include a complicated pixel circuit and is sensitive to voltage changes, so repair of a defective pixel mainly includes black spot repair. That is, when a bright spot is generated by a defective pixel, the black spot repair is performed as a method of removing a cathode.

SUMMARY

An organic light emitting diode display according to an exemplary embodiment includes a substrate including a display unit displaying an image and a peripheral portion surrounding the display unit, a plurality of scan lines on the substrate and extending in a first direction, a plurality of data lines intersecting the scan lines and extending in a second direction, a plurality of pixels in the display unit, each pixel including a pixel circuit portion connected to a corresponding scan line and a corresponding data line, and an organic light emitting diode connected to the pixel circuit portion, a plurality of first dummy lines in the display unit and extending in the first direction, at least one second dummy line in the peripheral portion and extending in the second direction, a plurality of dummy circuit portions on the peripheral portion and connected to a corresponding first dummy line and the at least one second dummy line, a plurality of driving pads on the peripheral portion and connected to end portions of the plurality of data lines, at least one dummy driving pad on the peripheral portion and connected to an end portion of the at least one second dummy line, and a driving circuit configured to transmit a data signal to the plurality of driving pads and to the at least one dummy driving pad.

The dummy circuit portion may be connected to the end portion of the first dummy line.

A plurality of driving circuit output lines connecting the driving circuit, and a plurality of driving pads and dummy driving pads, and an amplifier positioned at the driving circuit output line may be further included.

The driving circuit may transmit the same data signal as the data signal transmitted to the driving pad connected to a faulty pixel among a plurality of pixels to the dummy driving pad connected to the dummy circuit portion.

A dummy connection wire intersecting the driving circuit output line may be further included.

The dummy circuit portion and the pixel circuit portion may be the same circuit.

Also, an organic light emitting diode display according to another exemplary embodiment includes a substrate including a display unit displaying an image and a peripheral portion enclosing the display unit, a plurality of scan lines formed on the substrate and extending in a first direction, a plurality of data lines intersecting the scan lines and extending in a second direction, a plurality of pixels formed at the display unit and including a pixel circuit portion connected to the scan line and the data line and an organic light emitting diode connected to the pixel circuit portion, a first dummy line formed at the peripheral portion and extending in the first direction, a second dummy line formed at the display unit and extending in the second direction, a plurality of dummy circuit portions formed at the peripheral portion and connected to the first dummy line and the second dummy line, a plurality of driving pads formed at the peripheral portion and connected to end portions of a plurality of data lines, a dummy driving pad formed at the peripheral portion and connected to end portion of the first dummy line, and a driving circuit transmitting a data signal to a plurality of driving pads and a dummy scan signal to the dummy driving pad.

The dummy circuit portion may be connected to the end portion of the second dummy line.

The dummy circuit portion and the pixel circuit portion may be connected to the same data line.

A plurality of pixels may be disposed to be adjacent in the second direction thereby forming a pixel array, and the second dummy line may be formed for each pixel array.

A plurality of pixels may include a plurality of dots made of a red pixel, a green pixel, and a blue pixel, wherein the plurality of dots may be disposed to be adjacent in the second direction thereby forming a dot column, and the second dummy line may be respectively formed for one dot column.

A third dummy line formed at the peripheral portion and extending in the first direction, and a fourth dummy line formed at the display unit and extending in the first direction may be further included.

A plurality of dummy circuit portions may include a plurality of dummy circuit dots made of a red dummy circuit portion, a green dummy circuit portion, and a blue dummy circuit portion, the third dummy line may be respectively formed for one dummy circuit dot, and the third dummy line and the fourth dummy line may be connected to the second dummy line.

A repair method of an organic light emitting diode display according to an exemplary embodiment includes testing a faulty pixel of the organic light emitting diode display, insulating the pixel circuit portion and the organic light emitting diode of the faulty pixel detected in the step of testing the faulty pixel, and short-circuiting a first dummy line adjacent to the faulty pixel among a plurality of first dummy lines to the organic light emitting diode to the faulty pixel.

Transmitting the same data signal as the data signal transmitted to the driving pad connected to the faulty pixel to the dummy driving pad connected to the dummy circuit portion by using the driving circuit may be further included.

The dummy circuit portion may be connected to the end portion of the second dummy line.

A plurality of driving circuit output lines connecting the driving circuit and a plurality of driving pads and a dummy connection wire intersecting the driving circuit output line may be further included, and connecting the driving pad connected to the faulty pixel among a plurality of pixels and the dummy driving pad by using the dummy connection wire may be further included.

Further, a repair method of an organic light emitting diode display according to another exemplary embodiment includes testing a faulty pixel of the organic light emitting diode display, insulating the pixel circuit portion and the organic light emitting diode of the faulty pixel detected in the step of testing the faulty pixel, and short-circuiting the second dummy line adjacent to the faulty pixel among a plurality of second dummy lines to the organic light emitting diode to the faulty pixel.

The dummy circuit portion and the pixel circuit portion may be connected to the same data line.

A plurality of pixels may be disposed to be adjacent in the second direction thereby forming a pixel array, and the second dummy line may be respectively formed for one pixel array.

Transmitting the same dummy scan signal as the scan signal transmitted to the scan line connected to the faulty pixel to the first dummy line by using the driving circuit may be further included.

A plurality of pixels may include a plurality of dots made of a red pixel, a green pixel, and a blue pixel, the plurality of dots are disposed to be adjacent in the second direction thereby forming a dot column, and the second dummy line may be respectively formed for one dot column.

A third dummy line formed at the peripheral portion and extending in the first direction may be further included.

A plurality of dummy circuit portions may include a plurality of dummy circuit dots made of a red dummy circuit portion, a green dummy circuit portion, and a blue dummy circuit portion, the third dummy line may be respectively formed for one dummy circuit dot, and the third dummy line is connected to the second dummy line.

The short-circuiting of the second dummy line and the organic light emitting diode of the faulty pixel may include short-circuiting the third dummy line connected to the second dummy line and one among the dummy circuit portions, and short-circuiting the fourth dummy line connected to the second dummy line and the insulated organic light emitting diode.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In order to clarify embodiments, parts that are not connected with the description may be omitted, and same elements or equivalents are referred to by the same reference numerals throughout the specification.

In the drawings, the size and thickness of each element is approximately shown for better understanding and ease of description. Therefore, embodiments are not limited to the drawings. In the drawings, the thickness of layers, films, panels, regions, etc., may be exaggerated for clarity. Further, it will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, a statement regarding an upper part of a target portion indicates an upper part or a lower part of a target portion, rather than the target portion always being positioned at the upper side based on a gravity direction.

Now, an organic light emitting diode display according to an exemplary embodiment will be described with reference to FIGS. 1 and 2.

Figure 1:
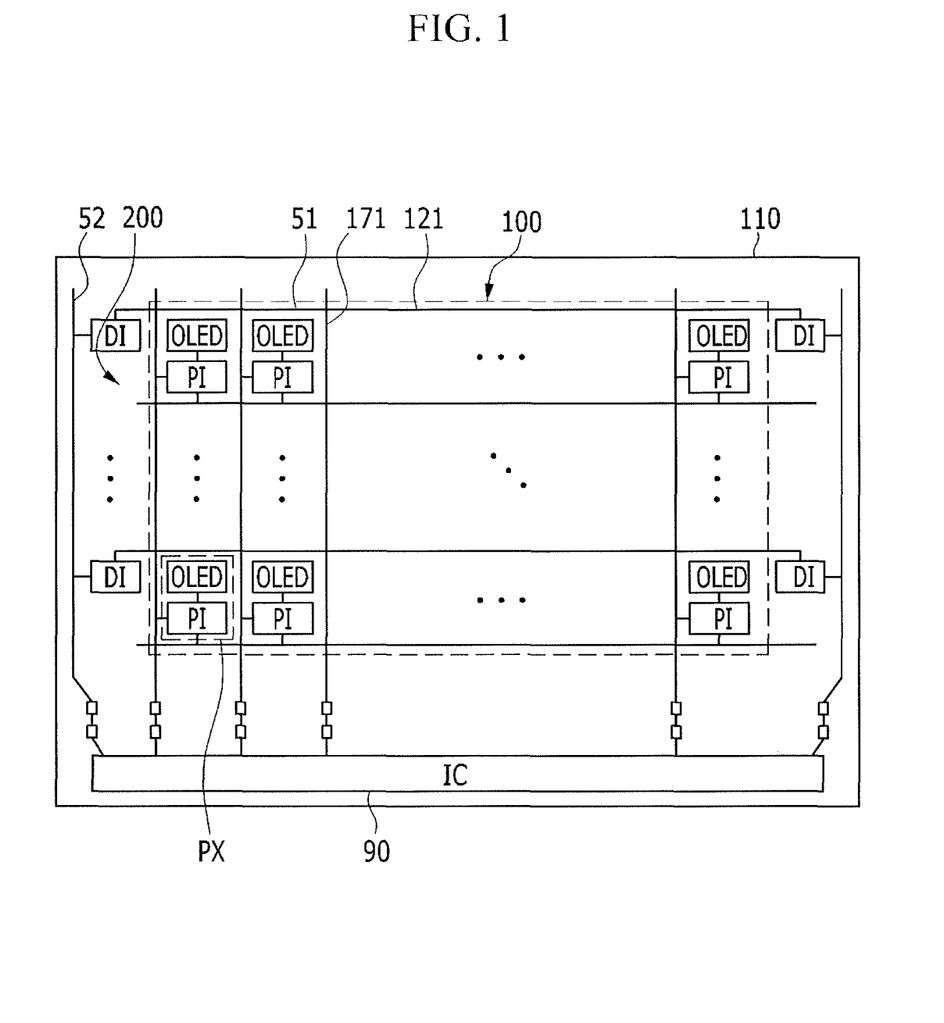
FIG. 1 illustrates a schematic circuit diagram of an organic light emitting diode display according to an exemplary embodiment.
Figure 2:
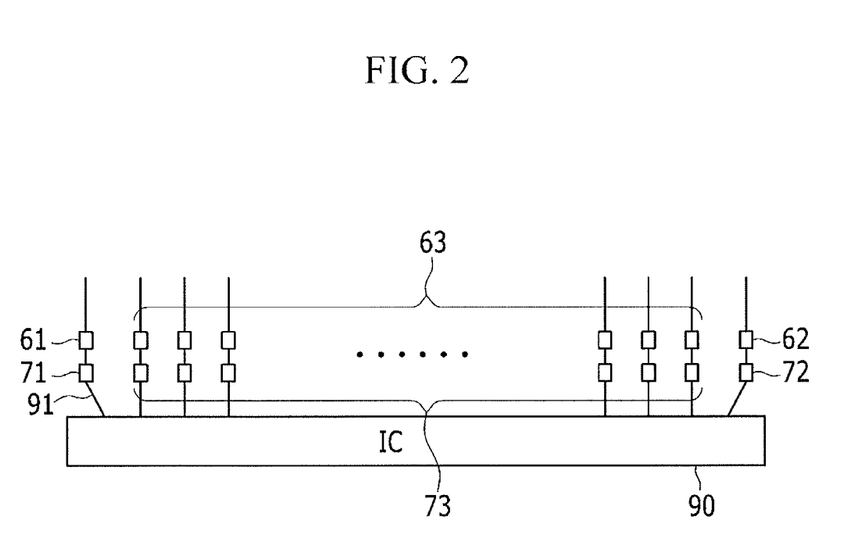
FIG. 2 illustrates an enlarged view of a peripheral portion of an organic light emitting diode display according to an exemplary embodiment.

FIG. 1 illustrates a circuit diagram of an organic light emitting diode display according to an exemplary embodiment, and FIG. 2 illustrates an enlarged, partial view of a peripheral portion of the organic light emitting diode display in FIG. 1.

As shown in FIG. 1 and FIG. 2, an organic light emitting diode display according to an exemplary embodiment may include a substrate 110, a plurality of scan lines 121 formed on the substrate 110, a plurality of data lines 171, a plurality of pixels PX, a plurality of first dummy lines 51, a pair of second dummy lines 52, a plurality of dummy circuit portions DI connected to the first dummy lines 51 and the second dummy lines 52, a plurality of driving pads 63, a pair of dummy driving pads 61 and 62, and a driving integrated circuit (IC) 90.

The substrate 110 includes a display unit 100 displaying an image, and a peripheral portion 200 surrounding, e.g., enclosing, the display unit 100. Most of the scan lines 121, the data lines 171, the pixels PX, and the first dummy lines 51 are formed in the display unit 100, and end portions of the scan lines 121, end portions of the data lines 171, end portions of the first dummy lines 51 and the second dummy lines 52, the dummy circuit portion DI, the driving pads 63, the dummy driving pads 61 and 62, and the driving circuit 90 are formed in the peripheral portion 200.

The scan line 121 transmits a scan signal and extends in a horizontal direction, which is a first direction, and the data line 171 transmits a data signal and extends in a vertical direction, which is a second direction, thereby intersecting the scan line 121.

The pixel PX includes a pixel circuit portion PI connected to the scan line 121 and the data line 171, and an organic light emitting diode (OLED) connected to the pixel circuit portion PI. The pixel circuit portion PI includes a plurality of thin film transistors and capacitors to drive the organic light emitting diode (OLED), and the organic light emitting diode (OLED) includes a cathode, an anode, and an organic emission layer.

The first dummy line 51 is formed in the display unit 100 and extends in the horizontal direction, and the second dummy line 52 is formed in the peripheral portion 200 and extends in the vertical direction. The dummy circuit portion DI is formed in the peripheral portion 200 and is connected to the first dummy line 51 and the second dummy line 52. The dummy circuit portion DI is respectively formed at a right side and a left side of the display unit 100, and is connected to an end portion of the first dummy line 51. The dummy circuit portion DI may be a circuit having a same structure as the pixel circuit portion PI.

The driving pads 63 are connected to end portions of respective ones of the plurality of data lines 171, and the dummy driving pads 61 and 62 are connected to respective end portions of the second dummy line 52. The driving circuit 90 transmits a data signal to the plurality of driving pads 63, and to the dummy driving pads 61 and 62, and may include a timing controller.

A plurality of driving circuit output lines 91 are formed between the driving circuit 90 and the plurality of driving pads 63 and connect the driving circuit 90 and the plurality of driving pad 63. The driving circuit output lines 91 are also formed between the driving circuit 90 and the pair of dummy driving pads 61 and 62 and connect the driving circuit 90 and the pair of dummy driving pads 61 and 62. In the driving circuit output line 91, amplifiers 71, 72, and 73 to amplify a signal output from the driving circuit 90 may be formed.

As described above, the data signal passing through the dummy driving pads 61 and 62 is transmitted to the dummy circuit portion DI through the second dummy line 52, so the driving current (Id) generated in the dummy circuit portion DI is transmitted to the organic light emitting diode (OLED) through the first dummy line 51, and thereby the faulty pixel is driven as a normal pixel. However, for this, a repair process of insulating the pixel circuit portion PI and the organic light emitting diode (OLED) of the faulty pixel and short-circuiting the first dummy line 51 and the organic light emitting diode (OLED) is performed. This repair process will be described later.

A repair method of an organic light emitting diode display according to an exemplary embodiment will now be described with reference to FIG. 3.

Figure 3:
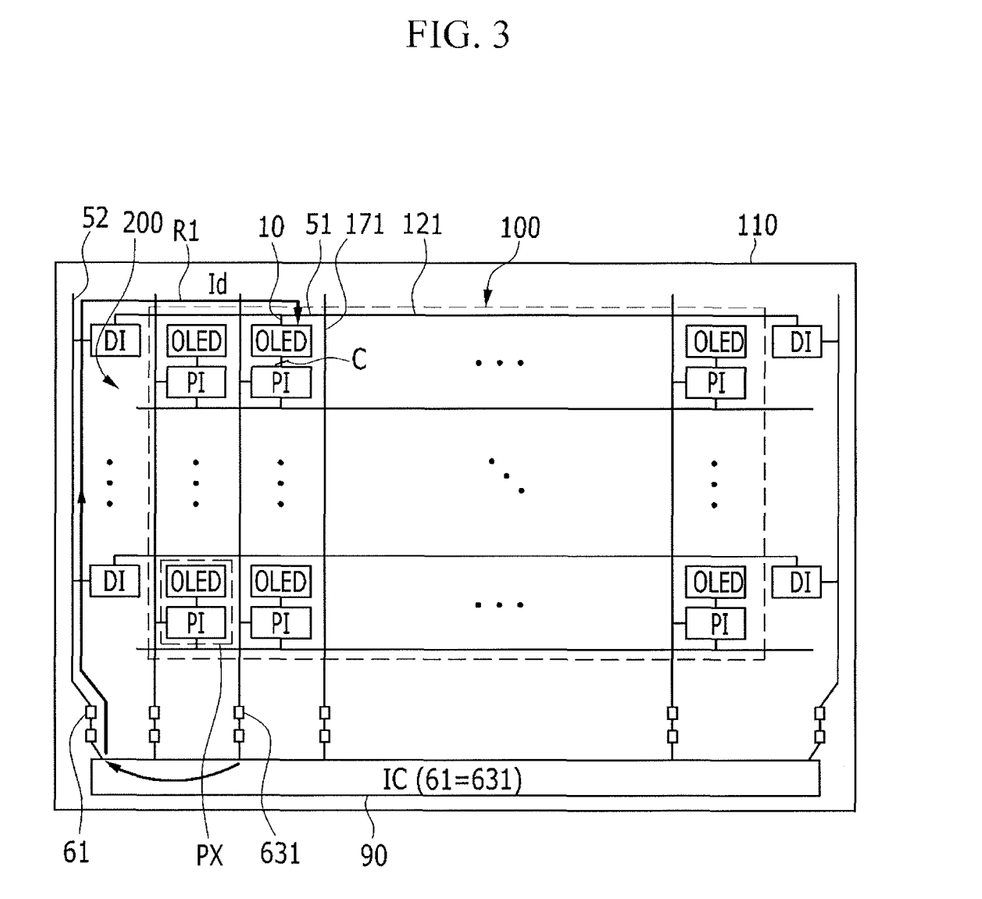
FIG. 3 illustrates a view of a repair method of an organic light emitting diode display according to an exemplary embodiment.

FIG. 3 illustrates a view of a repair method of an organic light emitting diode display according to an exemplary embodiment.

Referring to FIG. 3, in the repair method of the organic light emitting diode display according to an exemplary embodiment, a faulty pixel of the organic light emitting diode display is firstly tested, e.g., detected. For example, the faulty pixel may be tested by a method such as a visual inspection.

Next, the pixel circuit portion PI and the organic light emitting diode (OLED) of the detected faulty pixel are insulated, e.g., separated, from each other. For example, a wire C connecting the pixel circuit portion PI and the organic light emitting diode (OLED) may be disconnected by using a laser.

Next, the first dummy line 51 adjacent to the faulty pixel among the plurality of first dummy lines 51 is short-circuited to the organic light emitting diode (OLED) of the faulty pixel. For example, the first dummy line 51 and the organic light emitting diode (OLED) may be short-circuited by using a laser. For the short-circuiting of the first dummy line 51 and the organic light emitting diode (OLED), a separate connecting member 10 is formed, and the first dummy line 51 and the organic light emitting diode (OLED) may be short-circuited by using the laser.

Next, the same data signal as the data signal transmitted to a driving pad 631 connected to the faulty pixel is also transmitted to the dummy driving pads 61 and 62 connected to the dummy circuit portion DI by using the driving circuit 90. At this time, to prevent a transmission path of the data signal from being elongated, the repair process uses the second dummy line 52 connected to a left dummy driving pad 61, i.e., a pad positioned to the left of the faulty pixel and at a left side of the display unit 100, and the second dummy line 52 connected to a right dummy driving pad 62, i.e., a pad positioned to the right of the faulty pixel and at the right side of the display unit 100.

Accordingly, the data signal passing through the dummy driving pads 61 and 62 is transmitted to the dummy circuit portion DI through the second dummy lines 52, and the driving current generated in the dummy circuit portion DI is transmitted to the organic light emitting diode (OLED) through the first dummy line 51. Therefore, the faulty pixel is driven as a normal pixel. That is, as shown in FIG. 3, the data signal and the driving current formed by the data signal are transmitted to the organic light emitting diode (OLED) through a first repair path R1.

As described above, the same data signal as the data signal transmitted to the faulty pixel is transmitted to the dummy circuit portion DI through the driving circuit 90, the dummy driving pads 61 and 62, and the second dummy line 52, and the driving current generated in the dummy circuit portion DI is transmitted to the organic light emitting diode (OLED) of the faulty pixel through the first dummy line 51, such that the faulty pixel is repaired and is driven as a normal pixel. While in the exemplary embodiment, the same data signal as the data signal transmitted to the driving pad 631 connected to the faulty pixel is transmitted to the dummy driving pad 61 connected to the dummy circuit portion DI by only using the driving circuit, embodiments are not limited thereto, e.g., a direct connection of the driving pad 631 to the faulty pixel and the dummy driving pad 61 by using a separate dummy connection wire may be possible.

Figure 4:
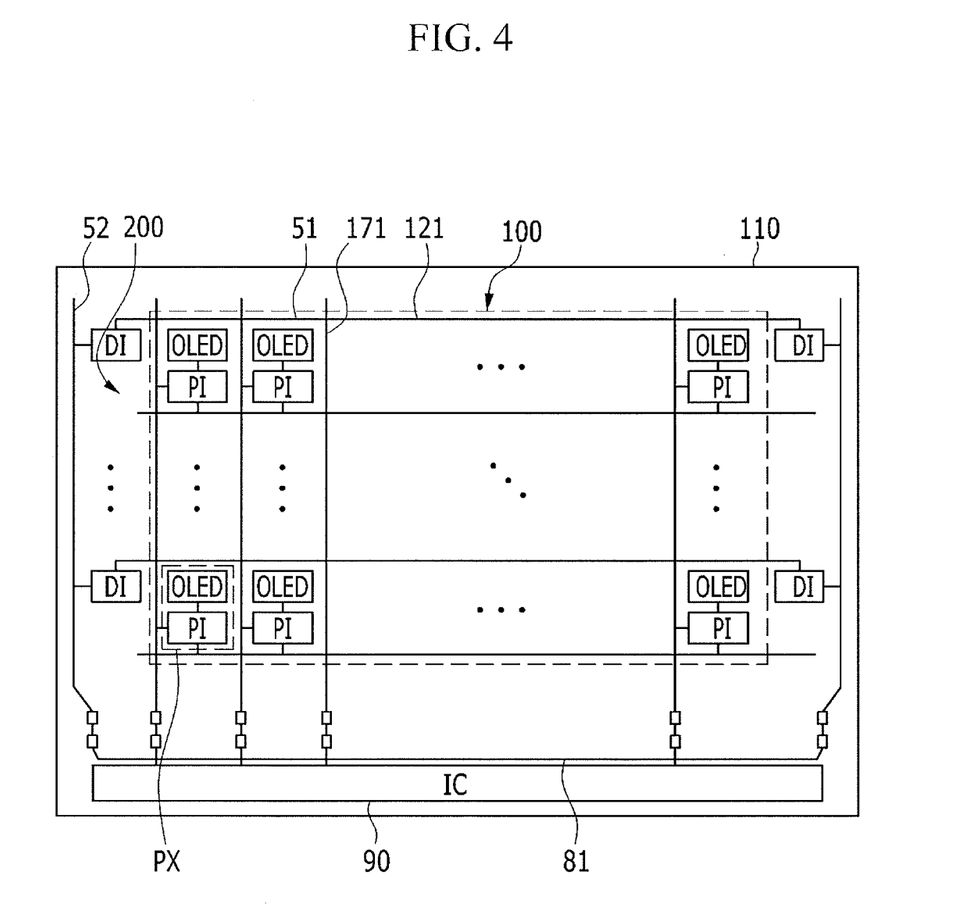
FIG. 4 illustrates an entire circuit diagram of an organic light emitting diode display according to another exemplary embodiment.

FIG. 4 illustrates a circuit diagram of an organic light emitting diode display according to another exemplary embodiment. The exemplary embodiment shown in FIG. 4 is substantially the same as the exemplary embodiment shown in FIG. 1 and FIG. 2, except for an additional dummy connection wire. Therefore, overlapping description are omitted.

As shown in FIG. 4, the organic light emitting diode display according to the current exemplary embodiment includes a dummy connection wire 81 intersecting the driving circuit output line 91. The dummy connection wire 81 may be formed with a different layer from the driving circuit output line 91, and the dummy driving pads 61 and 62 to be connected and the driving pad 631 connected to the faulty pixel may be short-circuited by using a laser. Also, the dummy connection wire 81 includes a switching structure, thereby connecting the dummy driving pads 61 and 62 and the driving pad 631 connected to the faulty pixel.

Figure 5:
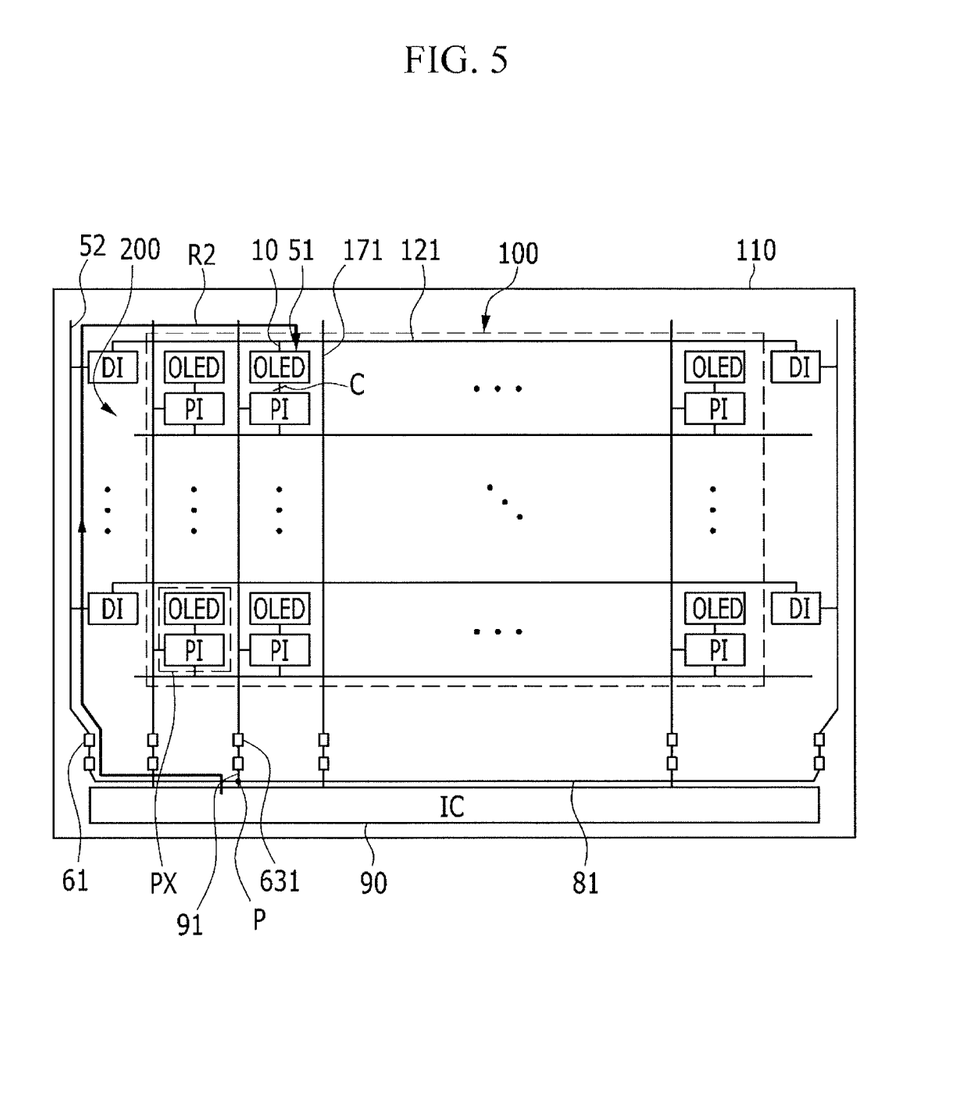
FIG. 5 illustrates a view of a repair method of an organic light emitting diode display according to another exemplary embodiment.

The repair method of the organic light emitting diode display according to another exemplary embodiment will be described with reference to FIG. 5. FIG. 5 illustrates a view of a repair method of an organic light emitting diode display according to another exemplary embodiment.

As shown in FIG. 5, the repair method of the organic light emitting diode display according to the current exemplary embodiment firstly tests the faulty pixel of the organic light emitting diode display. Next, the pixel circuit portion PI and the organic light emitting diode (OLED) of the detected faulty pixel are insulated. For example, the wire C connecting the pixel circuit portion PI and the organic light emitting diode (OLED) is disconnected by using a laser.

Next, the first dummy line 51 adjacent to the faulty pixel among the plurality of first dummy lines 51 is short-circuited to the organic light emitting diode (OLED) of the faulty pixel. The separate connecting member 10 is formed for the short-circuiting of the first dummy line 51 and the organic light emitting diode (OLED), and the first dummy line 51 and the organic light emitting diode (OLED) may be short-circuited by using the laser.

Next, the driving circuit output line 91 and the dummy connection wire 81 are short-circuited at a position P where the driving circuit output line 91 connected to the driving pad 631 connected to the faulty data line and the dummy connection wire 81 are crossed. As described above, the same data signal as the data signal transmitted to the driving pad 631 connected to the faulty pixel is transmitted to the dummy driving pad 61 connected to the dummy circuit portion DI by using the dummy connection wire 81.

Accordingly, the data signal passing through the dummy driving pads 61 and 62 is transmitted to the dummy circuit portion DI through the second dummy line 52 and the driving current generated in the dummy circuit portion DI is transmitted to the organic light emitting diode (OLED) through the first dummy line 51, such that the faulty pixel is driven as a normal pixel. That is, as shown in FIG. 5, the data signal and the driving current of the data signal are transmitted to the organic light emitting diode (OLED) through a second repair path R2.

As described above, the same data signal as the data signal transmitted to the faulty pixel is transmitted to the dummy circuit portion DI through the driving circuit 90, the dummy driving pads 61 and 62, and the second dummy line 52, and the driving current generated in the dummy circuit portion DI is transmitted to the organic light emitting diode (OLED) of the faulty pixel through the first dummy line 51, such that the faulty pixel is repaired and is driven as a normal, i.e., non-faulty, pixel. While the dummy circuit portion is positioned at the left side and the right side of the display unit, embodiments are not limited thereto, e.g., the dummy circuit portion may be positioned at an upper side and a lower side of the display unit.

Figure 6:
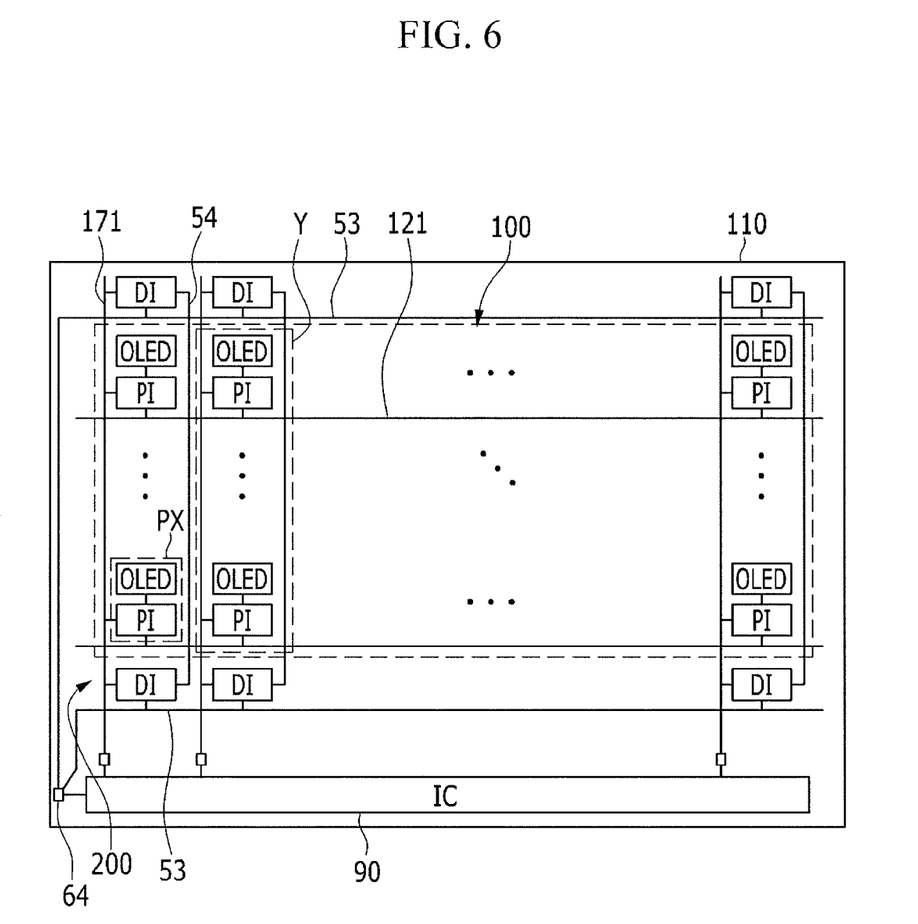
FIG. 6 illustrates an entire circuit diagram of an organic light emitting diode display according to another exemplary embodiment.

FIG. 6 illustrates a schematic circuit diagram of an organic light emitting diode display according to another exemplary embodiment.

The exemplary embodiment shown in FIG. 6 is substantially the same as the exemplary embodiment shown in FIG. 1 and FIG. 2, except for the position of the dummy circuit portion. Therefore, overlapping descriptions are omitted.

As shown in FIG. 6, the organic light emitting diode display according to the current exemplary embodiment includes the substrate 110, the plurality of scan lines 121 formed on the substrate 110, the plurality of data lines 171, the plurality of pixels PX, a pair of first dummy lines 53, a plurality of second dummy lines 54, the plurality of dummy circuit portions DI connected to the first dummy line 53 and the second dummy line 54, the plurality of driving pads 63, a dummy driving pad 64, and the driving integrated circuit (IC) 90.

Most of the scan lines 121, the data lines 171, the pixels PX, and the second dummy lines 54 are formed in the display unit 100, and end portions of the scan lines 121, end portions of the data lines 171, end portions of the second dummy lines 54 and the first dummy lines 53, the dummy circuit portion DI, the driving pads 63, the dummy driving pads 64, and the driving circuit 90 are formed in the peripheral portion 200.

The first dummy lines 53 extend in the horizontal direction, and the second dummy lines 54 extend in the vertical direction. The plurality of pixels PX is disposed to be adjacent in the vertical direction, thereby forming a pixel array, so each of the second dummy lines 54 is formed for one pixel array Y. That is, each second dummy line 54 extends along and is connected to a corresponding pixel array Y of vertically arranged pixels.

The dummy circuit portion DI is respectively formed at the upper and lower sides of the display unit 100 and is connected to the end portion of the second dummy line 54. The dummy circuit portion DI and the pixel circuit portion PI may be connected to the same data line 171, and the dummy circuit portion DI may be a circuit of the same structure as the pixel circuit portion PI.

The driving pad 63 is connected to the end portions of the plurality of data lines 171, and the dummy driving pad 64 is connected to the end portions of the first dummy line 53. The driving circuit 90 transmits the data signal to the plurality of driving pads 63, and the dummy scan signal is transmitted to the dummy driving pad 64. The dummy scan signal may be the same scan signal as the scan signal transmitted to the faulty pixel.

Figure 7:
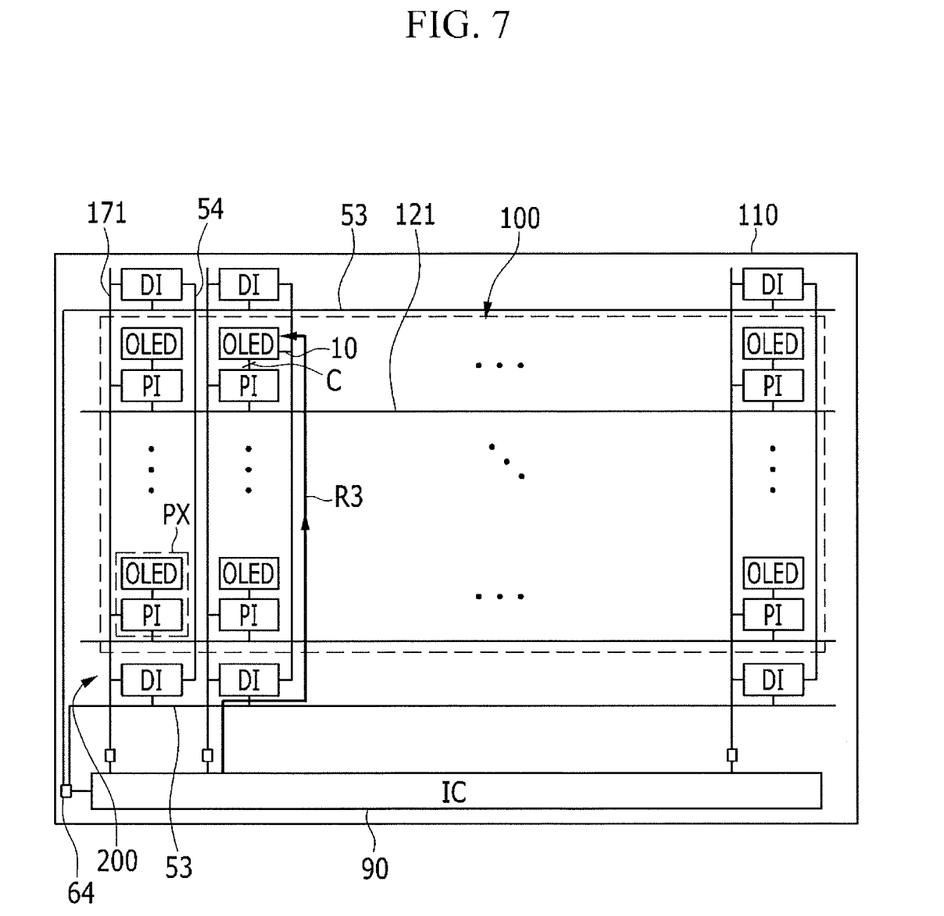
FIG. 7 illustrates a view of a repair method of an organic light emitting diode display according to another exemplary embodiment.

The repair method of the organic light emitting diode display according to another exemplary embodiment will be described with reference to FIG. 7. FIG. 7 illustrates a view of a repair method of an organic light emitting diode display according to another exemplary embodiment.

As shown in FIG. 7, the repair method of the organic light emitting diode display according to the current exemplary embodiment firstly tests the faulty pixel of the organic light emitting diode display. Next, the method insulates the pixel circuit portion PI and the organic light emitting diode (OLED) of the detected faulty pixel. For example, the wire C connecting the pixel circuit portion PI and the organic light emitting diode (OLED) is disconnected by using a laser.

Next, the second dummy line 54 adjacent to the faulty pixel among the plurality of second dummy lines 54 is short-circuited to the organic light emitting diode (OLED) of the faulty pixel. For the short-circuiting of the second dummy line 54 and the organic light emitting diode (OLED), the separate connecting member 10 is formed, and the second dummy line 54 and the organic light emitting diode (OLED) may be short-circuited by using the laser.

Next, the same dummy scan signal as the scan signal transmitted to the scan line 121 connected to the faulty pixel is transmitted to the first dummy line 53 by using the driving circuit 90. According to the same data signal as the data signal transmitted to the faulty pixel being transmitted to the organic light emitting diode (OLED) of the faulty pixel through the dummy circuit portion DI, the faulty pixel is repaired to be driven as a normal pixel. That is, as shown in FIG. 7, the data signal and the driving current of the data signal are transmitted to the organic light emitting diode (OLED) through a third repair path R3.

As described above, the same data signal as the data signal transmitted to the faulty pixel is transmitted to the dummy circuit portion DI through the data line 171, and the driving current generated in the dummy circuit portion DI is transmitted to the organic light emitting diode (OLED) of the faulty pixel through the second dummy line 54, such that the faulty pixel is repaired to be driven as a normal pixel. While the present embodiment describes a second dummy line for one pixel array Y, embodiments are not limited thereto, e.g., one second dummy line may be formed for one dot column.

Figure 8:
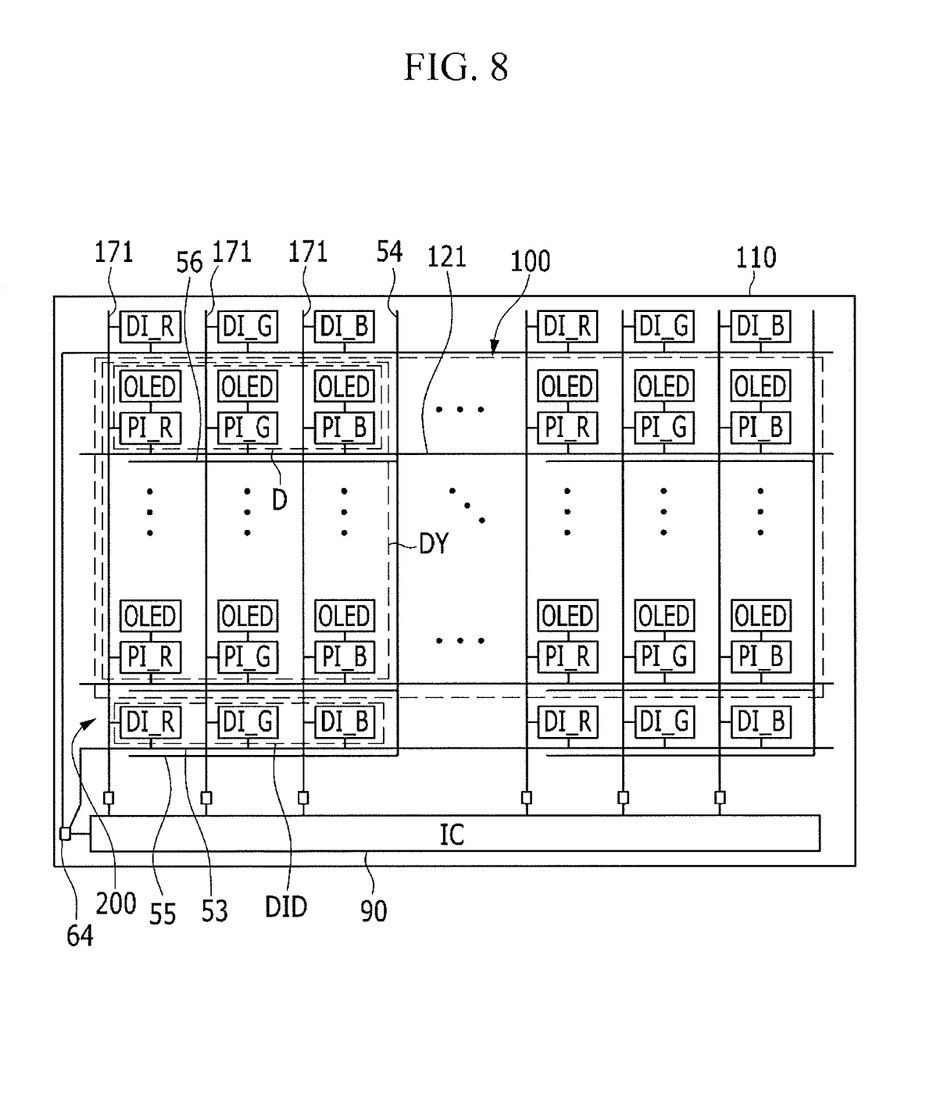
FIG. 8 illustrates an entire circuit diagram of an organic light emitting diode display according to another exemplary embodiment.

FIG. 8 illustrates a schematic circuit diagram of an organic light emitting diode display according to another exemplary embodiment. The exemplary embodiment shown in FIG. 8 is substantially the same as the exemplary embodiment shown in FIG. 6, except for the second dummy line being formed for one dot column. Therefore, overlapping descriptions are omitted.

As shown in FIG. 8, the organic light emitting diode display according to another exemplary embodiment includes the substrate 110, the plurality of scan lines 121 formed on the substrate 110, the plurality of data lines 171, the plurality of pixels PX, a pair of first dummy lines 53, the plurality of second dummy lines 54, a pair of third dummy lines 55, a plurality of fourth dummy lines 56, a plurality of dummy circuit portions DI connected to the first dummy line 53, the plurality of driving pads 63, a dummy driving pad 64, and a driving integrated circuit (IC) 90.

Most of the scan lines 121, the data lines 171, the pixels, the second dummy lines 54, and the fourth dummy lines 56 are formed in the display unit 100, and the end portions of the scan lines 121, the end portions of the data lines 171, the end portions of the second dummy lines 54, the end portions of the fourth dummy lines 56, the first dummy lines 53, the third dummy lines 55, the dummy circuit portions DI, the driving pads 63, the dummy driving pads 64, and the driving circuit 90 are formed in the peripheral portion 200.

The pixel PX includes a red pixel circuit portion PI_R, a green pixel circuit portion PI_G, and a blue pixel circuit portion PI_B that are connected to the scan line 121 and the data line 171, and the organic light emitting diode (OLED) is connected thereto.

The first dummy line 53, the third dummy line 55, and the fourth dummy line 56 extend in the horizontal direction, and the second dummy line 54 extends in the vertical direction. The plurality of pixels PX include the red pixel including the red pixel circuit portion PI_R and the organic light emitting diode (OLED) connected thereto, the green pixel including the green pixel circuit portion PI_G and the organic light emitting diode (OLED) connected thereto, and the blue pixel including the blue pixel circuit portion PI_B and the organic light emitting diode (OLED) connected thereto. The red pixel, the green pixel, and the blue pixel form the dot D, and a plurality of dots D are adjacent in the vertical direction thereby forming the dot column DY, and the second dummy line 54 is formed for one dot column DY.

The dummy circuit portion DI is formed at the upper side and the lower side of the display unit 100, and is connected to the end portion of the second dummy line 54. The dummy circuit portion DI and the pixel circuit portion PI are connected to the same data line 171, and the dummy circuit portion DI may be a circuit of the same structure as the pixel circuit portion PI.

The dummy circuit portion DI includes a plurality of dummy circuit dots DID made of the red dummy circuit portion DI_R, the green dummy circuit portion DI_G, and the blue dummy circuit portion DI_B. The third dummy line 55 is formed for one dummy circuit dot DID, and the third dummy line 55 and the fourth dummy line 56 are connected to the second dummy line 54.

Figure 9:
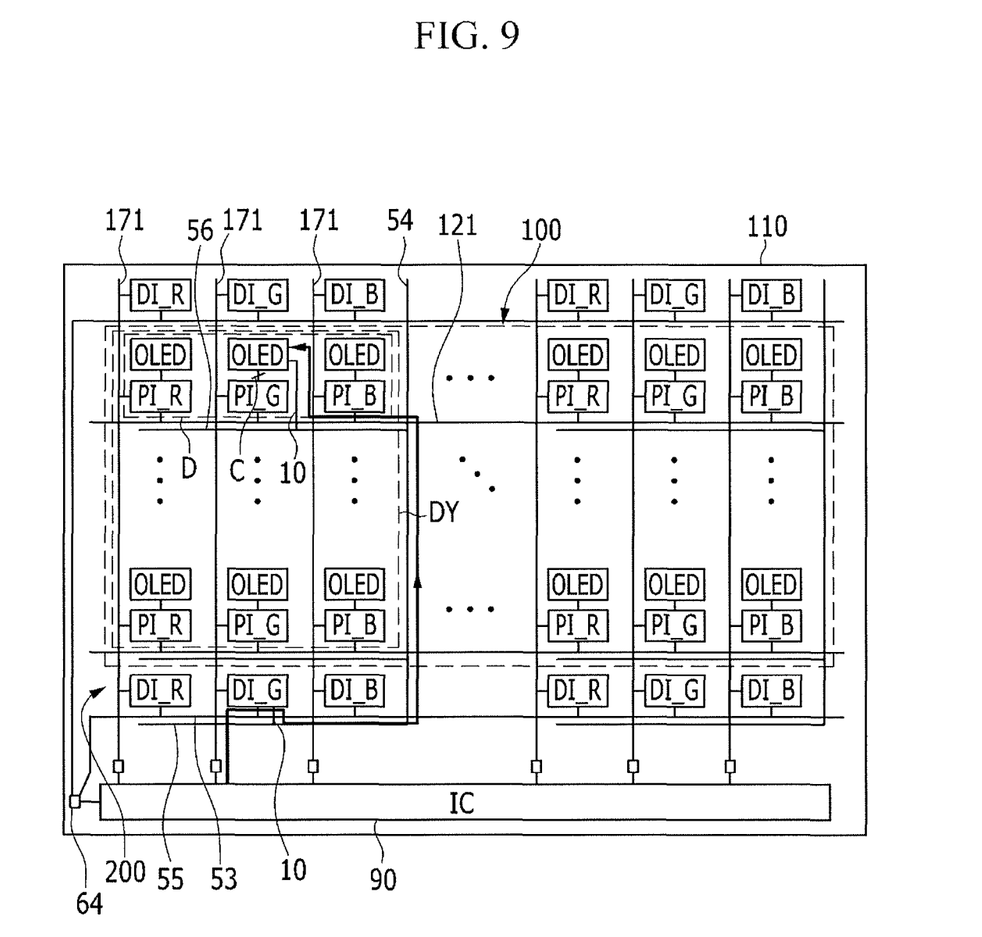
FIG. 9 illustrates a view of a repair method of an organic light emitting diode display according to another exemplary embodiment.

A repair method of the organic light emitting diode display according to another exemplary embodiment will be described with reference to FIG. 9. FIG. 9 illustrates a view of a repair method of an organic light emitting diode display according to another exemplary embodiment.

As shown in FIG. 9, the repair method of the organic light emitting diode display according to the current exemplary embodiment firstly tests the faulty pixel of the organic light emitting diode display. Next, the pixel circuit portion PI and the organic light emitting diode (OLED) of the detected faulty pixel are insulated. At this time, the wire C connecting the pixel circuit portion PI and the organic light emitting diode (OLED) is disconnected by using a laser.

Next, the third dummy line 55 connected to the second dummy line 54 adjacent to the faulty pixel among the plurality of second dummy lines 54 and the dummy circuit portion DI corresponding to the faulty pixel among the dummy circuit portion DI are short-circuited. Also, the fourth dummy line 56 connected to the second dummy line 54 and the organic light emitting diode (OLED) of the insulated faulty pixel are short-circuited. At this time, for the short-circuiting of the third dummy line 55 and the dummy circuit portion DI, the separate connecting member 10 is formed and the third dummy line 55 and the dummy circuit portion DI may be short-circuited by using the laser, for the short-circuiting of the fourth dummy line 56 and the organic light emitting diode (OLED), the separate connecting member 10 is formed, and the fourth dummy line 56 and the organic light emitting diode (OLED) may be short-circuited by using the laser.

Next, by using the driving circuit 90, the same dummy scan signal as the scan signal transmitted to the scan line 121 connected to the faulty pixel is transmitted to the first dummy line 53. According to the same data signal as the data signal transmitted to the faulty pixel being transmitted to the organic light emitting diode (OLED) of the faulty pixel through the dummy circuit portion DI, the faulty pixel is repaired to be driven as a normal pixel. That is, as shown in FIG. 9, the data signal and the driving current of the data signal are transmitted to the organic light emitting diode (OLED) through the fourth repair path R4.

As described above, the same data signal as the data signal transmitted to the faulty pixel is transmitted to the dummy circuit portion DI through the data line 171, and the driving current generated in the dummy circuit portion DI is transmitted to the organic light emitting diode (OLED) of the faulty pixel through the third dummy line 55, the second dummy line 54, and the fourth dummy line 56, such that the faulty pixel is repaired to be driven as a normal pixel. Also, by forming the third dummy line 55 and the fourth dummy line 56, without the second dummy line 54 formed for each pixel array, the faulty pixel may be repaired such that the aperture ratio may be improved.

By way of summary and review, a conventional black spot repair method easily repairs a bright spot into a black spot, thereby making a good product within black spot specifications. However, the black spot repair may be difficult within the specifications, as a size of the organic light emitting diode display is increased and an economic benefit is decreased.

According to embodiments, an organic light emitting diode display includes a repaired pixel, i.e., a defective pixel repaired into a normal pixel, and a repair method thereof. That is, by forming a dummy circuit portion at an end portion of the first dummy line parallel to a scan line, and connecting an end portion of a second dummy line parallel to a data line and a dummy driving pad, after insulating the pixel circuit portion of the faulty pixel and the organic light emitting diode, a same data signal as the data signal transmitted to the faulty pixel is transmitted to the organic light emitting diode of the faulty pixel through the dummy driving pad and the dummy circuit portion, such that the faulty pixel is repaired to be driven as a normal pixel. Further, by forming the dummy circuit portion at the end portion of the second dummy line parallel to the data line and connecting the data line and the first dummy line to the dummy circuit portion, after insulating the pixel circuit portion of the faulty pixel and the organic light emitting diode, the same dummy scan signal as the scan signal transmitted to the scan line connected to the faulty pixel is transmitted to the first dummy line such that the same data signal as the data signal transmitted to the faulty pixel is transmitted to the organic light emitting diode of the faulty pixel through the dummy circuit portion, and thereby the faulty pixel is repaired to be driven as the normal pixel. At this time, the second dummy line may be respectively formed for one dot thereby improving an aperture ratio.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a substrate including a display unit displaying an image and a peripheral portion surrounding the display unit;
   a plurality of scan lines on the substrate and extending in a first direction;
   a plurality of data lines intersecting the scan lines and extending in a second direction;
   a plurality of pixels in the display unit, each pixel including a pixel circuit portion connected to a corresponding scan line and a corresponding data line, and an organic light emitting diode connected to the pixel circuit portion;
   a plurality of first dummy lines in the display unit and extending in the first direction;
   at least one second dummy line in the peripheral portion and extending in the second direction;
   a plurality of dummy circuit portions on the peripheral portion, the plurality of dummy circuit portions directly connected to a corresponding first dummy line and connected to the at least one second dummy line;
   a plurality of driving pads on the peripheral portion and connected to end portions of the plurality of data lines;
   at least one dummy driving pad on the peripheral portion and connected to an end portion of the at least one second dummy line; and
   a driving circuit configured to transmit a data signal to the plurality of driving pads and to the at least one dummy driving pad,
   wherein the pixel circuit portion includes a plurality of thin film transistors and capacitors, and the dummy circuit portion and the pixel circuit portion have a circuit of a same structure.

2. The organic light emitting diode display as claimed in claim 1, wherein each dummy circuit portion is directly connected to an end portion of the corresponding first dummy line.

3. The organic light emitting diode display as claimed in claim 2, further comprising:
   a plurality of driving circuit output lines connecting the driving circuit to the plurality of driving pads and the at least one dummy driving pad; and
   a plurality of amplifier positioned at the driving circuit output lines.

4. The organic light emitting diode display as claimed in claim 3, wherein the driving circuit transmits a same data signal to a driving pad connected to a faulty pixel among the plurality of pixels and to the at least one dummy driving pad connected to the dummy circuit portion.

5. The organic light emitting diode display as claimed in claim 3, further comprising a dummy connection wire intersecting the driving circuit output lines.

6. The organic light emitting diode display as claimed in claim 1, wherein the dummy circuit portion and the pixel circuit portion have a same circuit.

* * * * *